United States Patent [19]

West

[11] Patent Number: 5,328,376

[45] Date of Patent: Jul. 12, 1994

[54] PATTERNED LAMINAR ELECTRICAL INTERCONNECTION

[76] Inventor: Frederick A. West, 507 Forrest Ct., Crestview, Fla. 32536

[21] Appl. No.: 45,924

[22] Filed: Apr. 12, 1993

Related U.S. Application Data

[63] Continuation-in-part of Ser. No. 475,578, Feb. 6, 1990, Pat. No. 5,201,974, and a continuation-in-part of Ser. No. 549,876, Jul. 6, 1990, and a continuation-in-part of Ser. No. 33,722, Apr. 3, 1987, Pat. No. 4,790,438.

[51] Int. Cl.$^5$ .............................................. H01R 9/09
[52] U.S. Cl. ...................................... 439/65; 439/668
[58] Field of Search ............... 439/67, 77, 63, 284, 439/287, 492, 493, 495, 660, 668, 669, 65; 174/117 F, 177 FF, 268; 333/1, 238, 243; 156/47, 51, 52

[56] References Cited

U.S. PATENT DOCUMENTS

| | | | |
|---|---|---|---|
| 3,132,204 | 5/1964 | Giellerup | 174/117 A |
| 3,629,787 | 12/1971 | Wilson | 439/67 |
| 4,116,516 | 9/1978 | Griffin | 439/67 |
| 4,201,435 | 5/1980 | Nakamura et al. | 439/66 |
| 4,798,918 | 1/1989 | Kabadi | 174/117 FF |
| 5,003,273 | 3/1991 | Oppenberg | 174/117 FF |

OTHER PUBLICATIONS

Connections and Interconnections Handbook, vol. 2, pp. 4–26 to 4–30, 1979.

Primary Examiner—Neil Abrams
Attorney, Agent, or Firm—Charles A. McClure

[57] ABSTRACT

Patterned laminar electrical interconnection, such as in the form of wiring harness, preferably including integrally formed end connectors, and made of individual patterned electrically conductive laminae, each lamina having electrically conductive portions and non-conductive portions contiguous side-by-side from end-to-end thereof, and being respectively substantially homogeneous electrically through the lamina thickness face-to-face. Like and/or unlike laminae are juxtaposed and bonded together face-to-face for overtly three-dimensional interconnecting laminated structures.

15 Claims, 3 Drawing Sheets

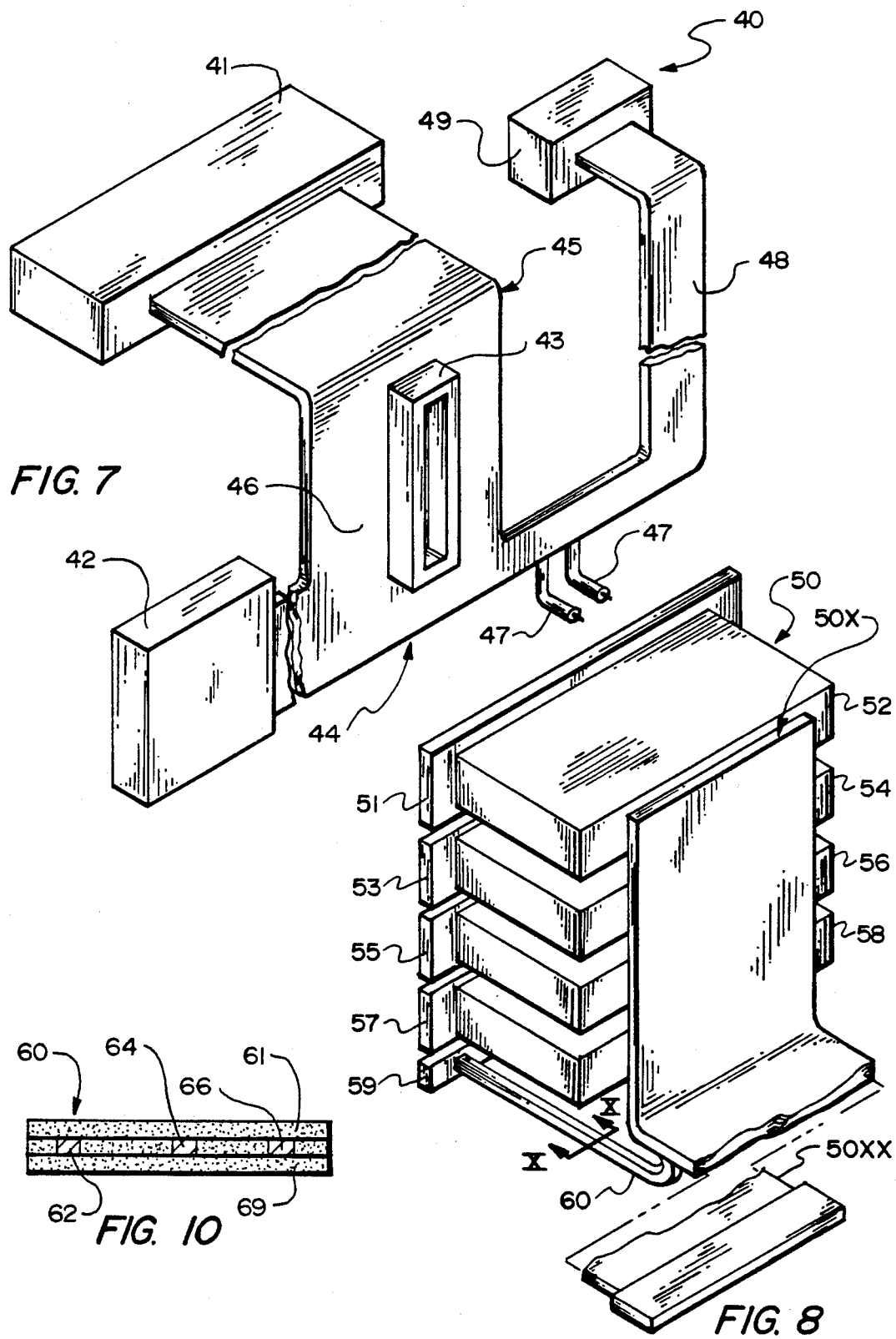

PATTERNED LAMINAR ELECTRICAL INTERCONNECTION

This application is a continuation-in-part of several of my co-pending applications: Ser. No. 475,578 filed Feb. 6, 1993, issuing Apr. 13, 1993 as U.S. Pat. No. 5,201,974; and Ser. No. 549,876 filed Jul. 6, 1990; and Ser. No. 033,722, filed Apr. 3, 1987, now U.S. Pat. No. 4,790,438. The contents of each of these identified copending applications are incorporated into the present application by this reference.

TECHNICAL FIELD

This invention relates to patterned laminar electrical interconnection, as by a substantially two-dimensional lamina or a three-dimensional laminate of such laminae, with integral connectors.

BACKGROUND OF THE INVENTION

Interconnection of electrical circuitry by means of solid electrical conductors, such as wiring having adjacent non-conductive material or substantially three-dimensional waveguides with or without center electrodes, often involves failure-prone electrical plug-in connection and/or solder-mediated bonding. Intermittency or total lapsing of electrical continuity, as at plug-in connectors, is especially troublesome in transmission of low-voltage signals, as are becoming more common in communications and control applications.

Whereas composite connectors have been disclosed, such as by DuRocher in U.S. Pat. No. 4,067,945, the problem of assuring positive interconnection and discouraging unwanted disconnection has remained substantially unchanged. Multi-layered printed circuit boards, such as disclosed by Landis in U.S. Pat. No. 4,673,904 or by King et al. in U.S. Pat. No. 4,912,020, have not ameliorated the connection problem.

The present inventor's referenced patent applications disclose, inter alia, making patterned electrically conductive laminae, having electrically conductive portions and non-conductive portions contiguous side-by-side, respectively substantially homogeneous electrically through the lamina thickness face-to-face, in several ways:

(i) depositing conductive and non-conductive material side-by-side onto a preferably flexible substrate, then removing the substrate;

(ii) filling an intaglio non-conductive structure with conductive material and removing the intaglio base, as by shaving it away; and (iii) depositing conductive and non-conductive material side-by-side onto a substrate so foraminous as to leave the conductive portions of the lamina substantially as conductive face-to-face as they would be in the absence of the foraminous substrate.

SUMMARY OF THE INVENTION

A primary object of the present invention is to interconnect electrical circuitry positively over optionally long distances without adding separate connectors at either end or intermediately.

Another object of this invention is to provide electrical conductors having integral end connectors for plug-in interconnection.

A further object of the invention is to enable integral plug-in termination, to be bonded in place, or not, after interconnection.

In general, the objects of this invention are accomplished by means of patterned electrically conductive lamina with electrically conductive portions and non-conductive portions mutually contiguous side-by-side, some conductive portions as well as some of the non-conductive portions being substantially homogeneous electrically through the thickness of the lamina from face-to-face thereof, at least one of the latter conductive portions being continuous from one end of the lamina to another end thereof and terminating in a configuration adapted to fit a complementary configuration of some separate electrical circuitry.

A plurality or multiplicity of such laminae, similarly or dissimilarly patterned with side-by-side conductive and non-conductive portions, laminated together into three-dimensionally patterned electrical configurations (such as a waveguide with or without an axial conductor, for example) may continue similarly from one end to another, and may be adapted for plug-in complementary connection.

More particularly, the objects of the invention are attained by forming either substantially two-dimensional or three-dimensional wiring "harnesses" or similarly useful signal conductors configured for direct plug-in interconnection to separate electrical circuitry, and adapted for optional bonding to circuitry so interconnected.

Other objects of the present invention, together with means and methods for attaining the various objects, will become apparent from the following description and the accompanying diagrams of preferred embodiments presented here by way of example rather than limitation.

SUMMARY OF THE DRAWINGS

FIG. 7 is a perspective view of a second group of electrical circuit assemblies, including a multiple-ended sheet-like wiring harness interconnecting several such assemblies;

FIG. 8 is a perspective view of a third set of electrical circuit assemblies, including broad and narrow interconnecting wiring strips, interconnecting with one another as well as to assemblies;

FIG. 10 is a sectional elevation through the interconnecting narrow wiring strip, taken at X—X of FIG. 9.

DESCRIPTION OF THE INVENTION

Figure 1:
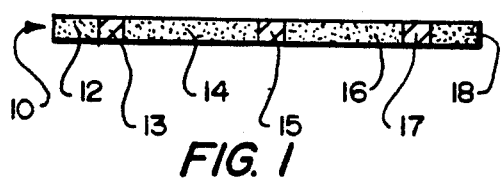
FIG. 1 is a transverse section through a patterned electrical circuit lamina useful according to the present invention.
Figure 9:
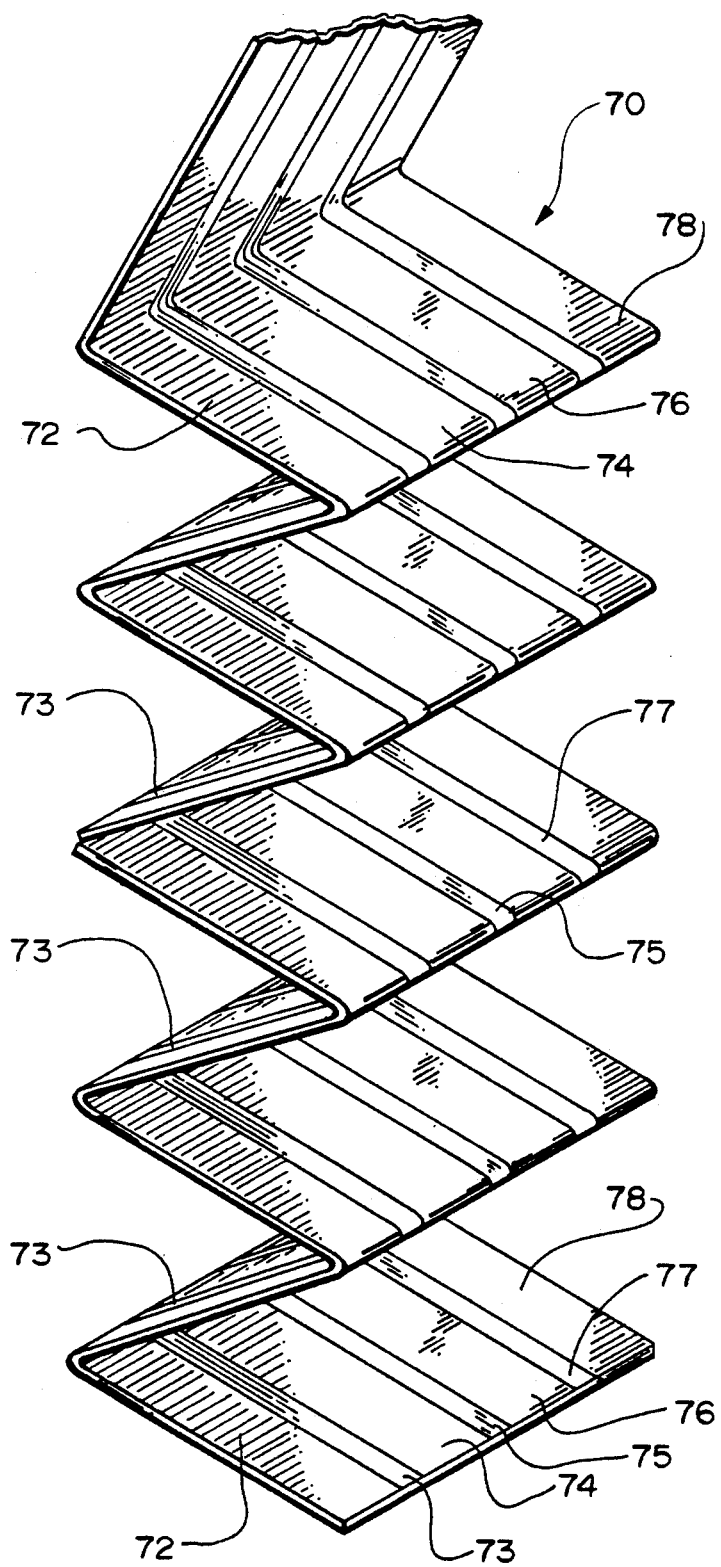
FIG. 9 is a partially folded (zigzag) relatively narrow interconnecting flexible wiring lamina useful in a wiring harness.

FIG. 1 shows lamina 10 in transverse cross-section, much as shown in my aforementioned applications: namely, similar to (i) section C—C of FIG. 12 of the first one, (ii) section C—C of FIG. 7B of the second one, and (iii) lamina D of FIG. 9 (in perspective) of the third one. All of these views show alternating conductive (hatched) and non-conductive (stippled) portions contiguously side-by-side. Each lamina is substantially homogeneous in its thickness dimension with regard to electrical conduction or non-conduction therethrough. In particular, lamina 10 here consists of three narrow conductive strips 13, 15, 17 of rectangular cross-section spaced laterally apart from one another by intervening non-conductive widths 14, 16, and flanked by respective non-conductive widths 12, 18 along the outermost edges. It will be understood that such a lamina will usually be covered above and below with non-conductive material if not to be laminated with other laminae of the same or different conductive patterning, as by lamination or by coating, dipping, wrapping, etc.

Figure 2:
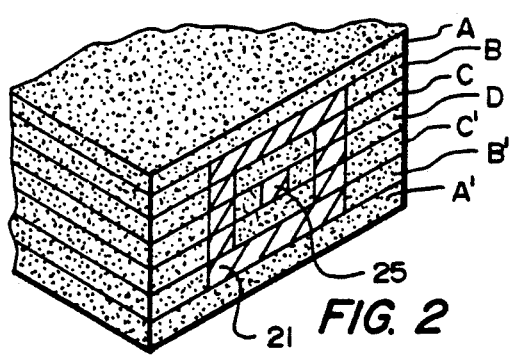
FIG. 2 is a end perspective view of a patterned electrical circuit laminate, useful according to this invention.

FIG. 2 shows rectangular harness 20 in end perspective, similar to (i) FIG. 13 of the first application, (ii) FIG. 8A of the second one, and (iii) FIG. 11 of the third one. Here waveguide 21 is a laminate of seven laminae (A, B, C, D, C', B', and A') stacked face-to-face much as in FIG. 9 of the third application. It will be understood that different letters designate unlike patterned laminae, whereas any given letter in unprimed or primed form designates like patterned laminae. The illustrations in the other two applications do not bother to show the top and bottom non-conductive layers—which are designated A and A' here as they may be made and applied in any suitable manner and not necessarily as is preferred for the composite conductive/non-conductive laminae. Of course, all of the laminae in waveguide 20, including the mid-lamina having axial or center conductor 25, have their conductive and non-conductive portions individually bonded, each within itself from face-to-face and laterally or side-by-side to whatever portion(s) may be adjacent. Hence, the interior of the waveguide—insofar as unoccupied by the center conductor—is filled with non-conductive material as a dielectric, which itself may be of different composition than whatever non-conductive composition is selected for the sides and/or top and bottom, outside the waveguide.

Figure 3:
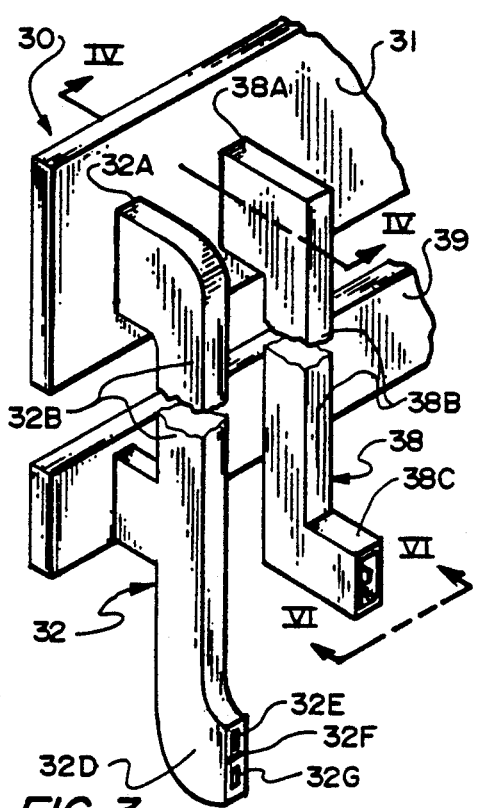
FIG. 3 is a perspective view of a first group of electrical circuit assemblies, including a pair of interconnecting cables or wiring harnesses according to this invention.

FIG. 3 shows, in perspective, assembly 30 of electrical circuitry, with a pair of electrical wiring harnesses 32, 38 plugged into one or both of upper and lower back plane components 31, 39. Left harness 32 has upper connector 32A plugged into upper back plane component 31, intermediate bight 32B characterized by a rectangular cross-section and leading to and past middle connector 32C, which is plugged into lower back plane component 39, and on to free end 32D having end connector slots 32D, 32E, 32F visible therein. Right harness 38 has upper connector 38A plugged into upper back plane component 39, intermediate bight 38B characterized by a square or other rectangular cross-section and leading to free end 38C, open to an internal coaxial waveguide. The ends of left harness 32 join their intervening bight curvilinearly, whereas the ends of right harness 38 join their intervening bight orthogonally, as does the intermediate connector of the left harness.

Figure 4:
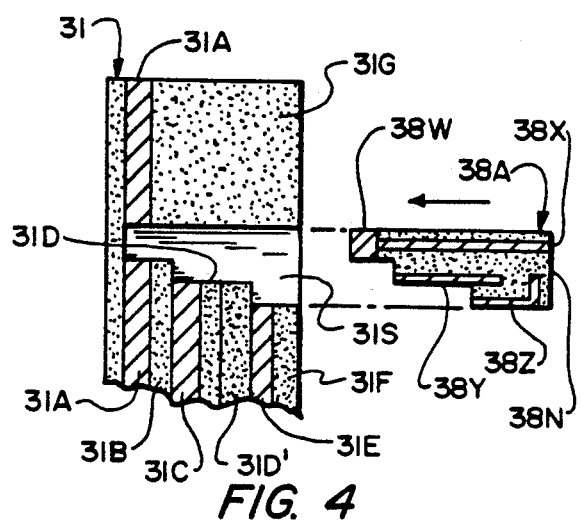
FIG. 4 is an exploded sectional plan of a portion of the same electrical back plane assembly and the left interconnecting laminar cable or wiring harness of FIG. 3 as adapted to plug together.

FIG. 4 shows, in exploded sectional plan, the junction of upper back plane component 31 and upper end connector 34A of right wiring harness 38. The back plane has conductors 31A, 31C, 31E (hatched) parallel to its non-conductive (stippled) rear surface 31R and front surface 31F, interrupted by slot 31S adapted to receive a plug connector thereinto—such as integral connector 38A. Slot 31S is doubly stepped in width, widest at its further end and stepping rightward twice from its left side toward its straight right side. At its greatest extent the slot interrupts rear conductor 31A otherwise along the whole interior wall of rear surface 31R. The slot is faced by non-conductive layer 31B at the left and block 31G contiguous with and orthogonal to conductor 31A at the rear and with its front surface 31F' at the right, aligned flush with front surface 31F of the slot at the left. Also at the left, non-conductive layer 31B intervenes between conductor 31A and conductor 31C, at the nearest approach on the left to block 31G at the right of the slot. Intermediate conductor 31C at the left, at an intermediate distance from the block at the right, is spaced apart by adjacent non-conductive layers 31D, 31D' also at an intermediate spacing or slot width from the block, from front conductor 31E at furthest spacing or slot width from block 31G and faced by front surface layer 31F.

Upper end connector 38C shown spaced from the foregoing back plane component in the exploded view of FIG. 4 is narrowest at its closest or forward end, where longest conductor 38X of three parallel conductors is enlarged into square head 38W, much like a match head on the end of a narrow match stem, itself conductive and embedded in non-conductive material 38N. Intermediate conductor 38Y is stepped back a bit at its forward end and does not extend all the way to the rear, so is shorter overall than stem 38X, but conductor 38Y continues out of the plane of the view rather than terminating altogether at its rearward end. Even shortest conductor 38Z is spaced from the rear portion of intermediate conductor 38Y by a portion of the non-conductive material, and it too is further faced by non-conductive material only rearwardly after making an L-turn, where it also departs from the plane of the view. It is apparent that, upon insertion of this connector end into complementary back plane slot 31S, connector head 38W will make contact on both its right and left sides with back plane conductor 31R, whereas connector conductor 38Y will make left side contact with the right end of back plane conductor 31C, and connector conductor 32Z will make contact left side contact with the right end of back plane conductor 31E.

Figure 5:
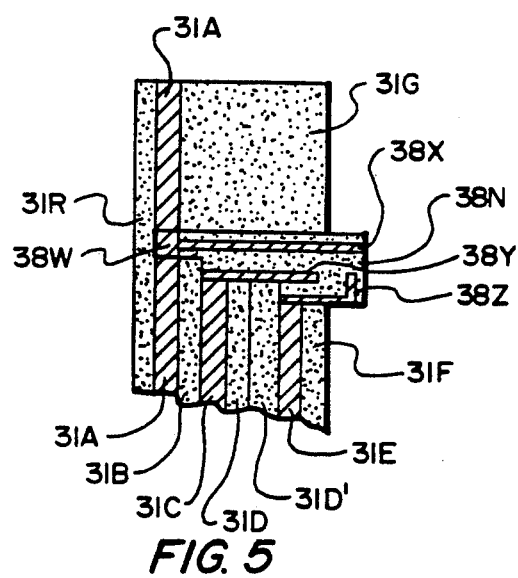
FIG. 5 is a sectional plan of the FIG. 4 components assembled, as taken along V—V on FIG. 3.

FIG. 5 shows, in sectional plan, the resulting junction of connector end 32A into slot 31S of upper back plane component 31 shown in solid perspective in FIG. 3 and in exploded plan in FIG. 4. No spaces are shown between the parts of the respective components, though the conductors are marked on both ends to indicate their origins, because they can be, and in many installations preferably are, bonded together. Bonding may be attained with an inherent or added adhesive (see below). The resulting inseparability eliminates troublesome transmission intermittency, often traceable to connector faults, and may be reversible (or not).

Figure 6:
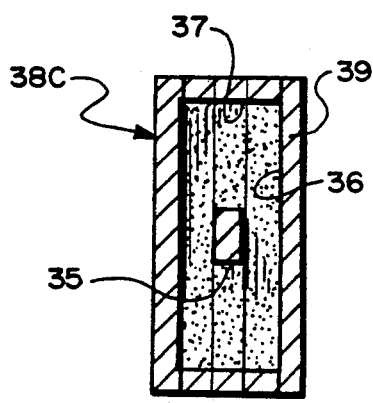
FIG. 6 is an end elevation of the right interconnecting cable or wiring harness of FIG. 3, taken as indicated at VI—VI thereon.

FIG. 6 shows, in sectional elevation, open free connector end portion 38C of the right wiring harness of FIG. 3. Waveguide 37 (hatched) is surrounded by a protruding frame of non-conductive (stippled) material 39. Recessed inside the frame is waveguide 37, and recessed in intervening non-conductive material 36 (stippled) is axial or center conductor 35 (hatched).

FIG. 7 shows, in perspective, assembly 40 of circuit board or card assemblies 41 and 42 at the top and the left of the view, edge card connector 45 at the center of the view, pair of wires 47, at the lower right, and connector plug 49 at the upper right. All are interconnected via sheet-like harness 44, which rises from the lower edge of the view, extends centrally upward to and past 43 and then horizontally as band 42 to 41, extends left as strip 46 to 43, and also extends as narrow strip 48 to the right and upward to 49. It will be understood that this harness is flexible and is shown cut away in places to suggest that it may well be much longer than this view alone may indicate, as the circuitry components can be remote from one another rather than close to one another, even if in a single computer housing, vehicle, etc. The edge or end interconnections are similar to the views of FIGS. 3, 4 but more elaborated because more connections are likely to be made here. In the instance of the pair of insulated wires shown at the lower right, their ends may be plugged into receiving bores analogous to the slot of FIG. 3.

FIG. 8 shows, in perspective, multiple card rack assembly 50, having four similar card racks 52, 54, 56, 58 stacked top to bottom on supports or panels 51, 53, 55, 57 and interconnected by wiring harness 50X (connections hidden here). Below 57 is narrow panel 59 (mostly hidden) connected by short narrow cable or wiring harness 54, which curves upward at its near end into a junction with hidden lower surface of much wider harness 55, which itself is shown broken away and offset as 50XX, which might join a variety of connectors (not shown here). The interconnecting ends of the wide harness may engage circuitry in any desired manner, whether as described with reference to FIGS. 3, 4, 5—or in conventional wrap or plug-in ways, with or without solder or other conductive adhesive intervening.

FIG. 9 shows, in perspective, patterned electrical structure 70 of this invention, which is sufficiently flexible to be collected or provided in a wavy zigzag or accordion-pleated configuration, which may be stored conveniently on a reel. This structure resembles the structure of FIG. 1 in having several parallel conductive striplike portions 73, 75, 77 extending from end to end and spaced apart by intervening non-conductive striplike portions 74, 76 and flanked along the edges by wider non-conductive striplike portions 72, 78.

FIG. 10 shows, in sectional elevation, narrow harness 60 of FIG. 8, which is seen to have a cross-section substantially as in FIGS. 1 and 9—covered here on top and bottom by non-conductive layers 61, 69 in addition to strips 62, 64, 66, 68. If left and right conductors 63 and 65 are carrying signal streams, intermediate conductor 65 might well be connected to a ground, to shield the signal streams from undesired influence upon one another. With more numerous conductors, the likelihood of interference would increase so grounded conductors should be interspersed appropriately.

This invention is directed toward the foregoing illustrated aspects of interconnection of electrical circuitry packages featuring characteristic laminar structures of the present inventor's aforementioned inventions. The interconnecting structures are conveniently called wiring harnesses (long relative to their width), whether substantially two-dimensional (thin vs. width/length) or more overtly three-dimensional (such as waveguides, for example).

The conductive material is conveniently metallic powder mixed with a liquid that enables it to be deposited conveniently, as by jetting, printing, or otherwise sizing it onto a removable or foraminous substrate. The liquid preferably includes a polymerizing or otherwise setting component adapted to form a solid matrix or network about the conductive particles for best structural integrity.

The optional adhesion of complementary end configurations may be attained by addition of a common organic adhesive, with or without a dopant of undissolved or dissolved materials conducive to conductivity; or may be solder, which however must be handled with care so that its melting temperature does not degrade the structure; or may even be residual plasticizer in only partially polymerized or "green" end structure, especially if the complementary configuration is similarly composed. For flexibility acrylic or vinyl composition is a good choice, whereas epoxy is more conducive to inflexibility.

Preferred embodiments and variants have been suggested for this invention. Other modifications may be made, as by adding, combining, deleting, or subdividing compositions, parts, or steps, while retaining all or some of the advantages and benefits of the present invention—which itself is defined in the following claims.

The claimed invention:

1. Laminate of a plurality of patterned electrically conductive laminae bonded face-to-face, comprising
    individual patterned electrically conductive laminae,
        each lamina having non-conductive portions and conductive portions mutually contiguous side-by-side,
        some conductive portions as well as the non-conductive portions thereof being substantially homogeneous electrically the thickness of the lamina from face-to-face thereof and substantially continuous from one end of the lamina to another end thereof,
    the plurality of face-to-face bonded laminae together being configured as a substantially three-dimensional conductor of electrical signals from end-to-end and adapted at one end to fit into an opening in electrical receptacle means and thereby to interconnect electrically a portion of each lamina to circuit means within the receptacle.

2. Article according to claim 1, comprising a waveguide.

3. Article according to claim 2, with an axial conductor.

4. Article according to claim 1, having an end configured as a protruding plug-in connector.

5. Article according to claim 4, inserted into and bonded to a complementary configuration within said receptacle opening.

6. Article according to claim 5, including adhesive bonding means as part of the article composition.

7. Article according to claim 5, including adhesive bonding means as a coating on the article end surface.

8. Wiring harness, comprising
    a laminate of patterned electrically conductive laminae bonded face-to-face, each lamina having electrically conductive portions and non-conductive portions contiguous side-by-side from end-to-end thereof, and being respectively substantially homogeneous electrically through the lamina thickness face-to-face, the laminate being configured stepwise at an end thereof complementarily to the configuration of another patterned electrical structure with which electrical interconnection is desired, and thereby adapted to make plugging connection connection therewith.

9. Article according to claim 8, including a plurality of like patterned electrically conductive laminae so laminated together.

10. Article according to claim 8, including a plurality of unlike patterned electrically conductive laminae so laminated together.

11. Article according to claim 8, including a plurality of unlike patterned electrically conductive laminae, and a plurality of like patterned electrically conductive laminae, so laminated together.

12. Article according to claim 11, including a waveguide made up of the like and unlike laminae, and extending substantially from one end to another end of the article.

13. Plug-in electrical connector comprising
a laminate of patterned electrically conductive laminae, each lamina having electrically conductive portions and non-conductive portions contiguous side-by-side and respectively substantially homogeneous electrically through the lamina thickness face-to-face,
the laminate protruding stepwise at an end thereof in form complementary to the configuration of a patterned electrically receptacle structure with which electrical interconnection is desired, and so adapted to make plugging connection with said electrical receptacle structure.

14. Plug-in electrical connector according to claim 13 plugged into said complementary receptacle structure.

15. Plug-in electrical connector plugged into said receptacle structure according to claim 14 and bonded thereto.

* * * * *